(12) United States Patent
Hsu et al.

(10) Patent No.: US 12,130,553 B2
(45) Date of Patent: *Oct. 29, 2024

(54) RESIST PUMP BUFFER TANK AND METHOD OF RESIST DEFECT REDUCTION

(71) Applicant: TAIWAN SEMICONDUCTOR MANUFACTURING COMPANY, LTD., Hsinchu (TW)

(72) Inventors: Chen-Yi Hsu, Zhubei (TW); Shang-Sheng Li, Zhubei (TW); Yung-Yao Lee, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/232,769

(22) Filed: Aug. 10, 2023

(65) Prior Publication Data

US 2023/0393481 A1 Dec. 7, 2023

Related U.S. Application Data

(63) Continuation of application No. 16/691,052, filed on Nov. 21, 2019, now Pat. No. 11,835,861.

(Continued)

(51) Int. Cl.
*G03F 7/16* (2006.01)
*H01L 21/67* (2006.01)

(52) U.S. Cl.
CPC ........ *G03F 7/162* (2013.01); *H01L 21/67017* (2013.01); *H01L 21/6715* (2013.01)

(58) Field of Classification Search
CPC ..... G03F 7/162; G03F 7/42; H01L 21/67017; H01L 21/6715
See application file for complete search history.

(56) References Cited

U.S. PATENT DOCUMENTS 6,340,643 B2 * 1/2002 Ueda ................ H01L 21/6715
438/758
6,648,201 B1 * 11/2003 Marinaro ............. B67D 1/0462
222/105

(Continued)

FOREIGN PATENT DOCUMENTS

CN 101061569 A * 10/2007 ............. G03F 7/162

OTHER PUBLICATIONS

Notice of Allowance issued in U.S. Appl. No. 16/691,052, dated Jul. 24, 2023.

(Continued)

*Primary Examiner* — James M Mellott
(74) *Attorney, Agent, or Firm* — STUDEBAKER & BRACKETT PC

(57) ABSTRACT

A resist material dispensing system includes a resist supply and a resist filter connected to the resist supply downstream from the resist supply. The resist material dispensing system includes a resist tank structure connected to the resist filter downstream from the resist filter and a resist pump device connected to the resist tank structure downstream from the resist tank structure. The resist tank structure is vertically arranged so that a resist material flows in a continuous downward flow from where the resist material enters the resist tank structure until the resist material exits the resist tank structure.

20 Claims, 13 Drawing Sheets

Related U.S. Application Data

(60) Provisional application No. 62/774,141, filed on Nov. 30, 2018.

(56) References Cited

U.S. PATENT DOCUMENTS

| | | | |
|---|---|---|---|
| 7,153,364 B1* | 12/2006 | Rangarajan | B05B 15/50 |
| | | | 118/612 |
| 2002/0037462 A1* | 3/2002 | Ogata | G03F 7/3021 |
| | | | 430/311 |
| 2003/0095870 A1* | 5/2003 | Park | F04B 43/06 |
| | | | 417/279 |
| 2004/0148048 A1* | 7/2004 | Farnworth | B29C 64/135 |
| | | | 382/141 |

OTHER PUBLICATIONS

Non-Final Office Action issued in U.S. Appl. No. 16/691,052, dated Mar. 24, 2023.
Final Office Action issued in U.S. Appl. No. 16/691,052, dated Aug. 24, 2022.
Non-Final Office Action issued in U.S. Appl. No. 16/691,052, dated May 10, 2022.
Final Office Action issued in U.S. Appl. No. 16/691,052, dated Nov. 9, 2021.
Non-Final Office Action issued in U.S. Appl. No. 16/691,052, dated May 25, 2021.

* cited by examiner

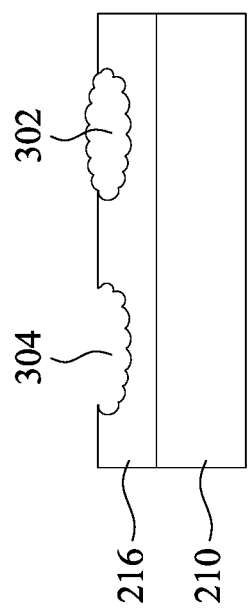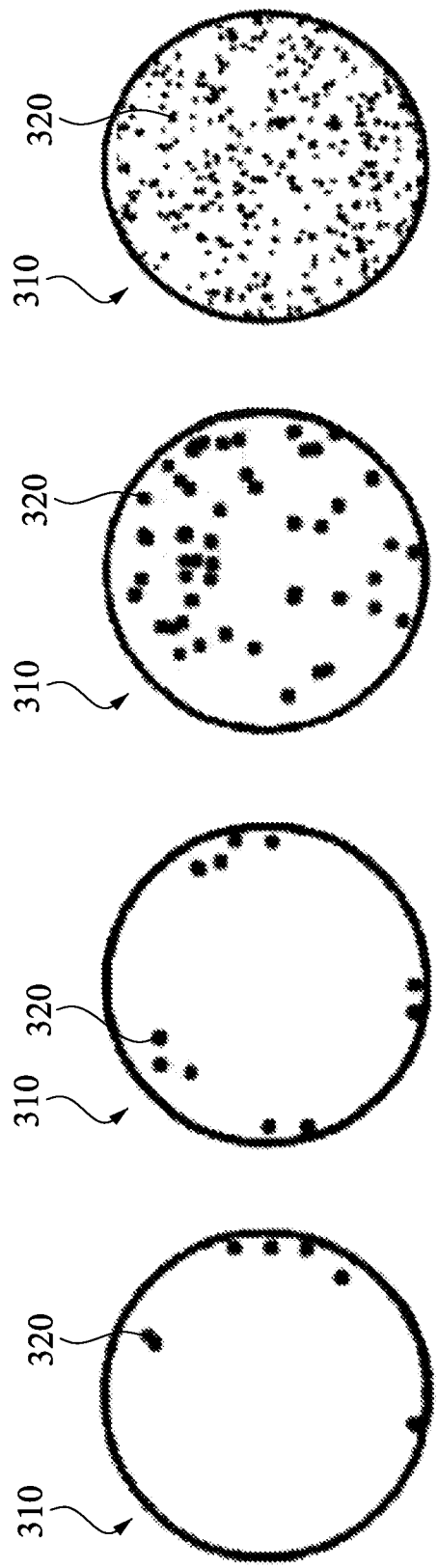

RESIST PUMP BUFFER TANK AND METHOD OF RESIST DEFECT REDUCTION

PRIORITY CLAIM AND CROSS-REFERENCE

This application is a continuation application of U.S. application Ser. No. 16/691,052 filed on Nov. 21, 2019, which claims priority to U.S. Provisional Application No. 62/774,141 filed on Nov. 30, 2018, entitled "Photoresist Pump Buffer Tank and Method of Photoresist Defect Reduction," the entire disclosure of which is incorporated herein by reference.

BACKGROUND

Lithography is used for patterning the surface of a wafer that is covered by a resist material. The resist material is patterned so that portions of the resist material can be selectively removed to expose underlying areas of the wafer for selective processing such as etching, material deposition, implantation and the like. Photolithography utilizes light energy beams, including ultraviolet light or X-ray, for selective exposure of the resist material. Alternatively, charged particle beams, e.g., electron beams and ion beams, have been used for high resolution lithographic resist exposure.

During an integrated circuit (IC) design, a number of layout patterns of the IC, for different steps of IC processing, are generated. The layout patterns include geometric shapes corresponding to structures to be fabricated on a wafer. The layout patterns may be patterns on a mask that are projected, e.g., imaged, on a resist layer on the wafer to create the IC. A lithography process transfers the pattern of the mask to the resist layer of the wafer such that etching, implantation, or other steps are applied only to predefined regions of the wafer. The resist material is a critical component of lithographic processing. To maintain a high device yield, the resist material coated on a wafer should be free of impurities and defects such as crystallized impurities. Therefore, a method of flowing and dispensing the resist material that avoids crystallization of the resist material is desirable.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B, 3C, 3D, and 3E illustrate resist defects on a top surface of a wafer.

DETAILED DESCRIPTION

Figure 1:
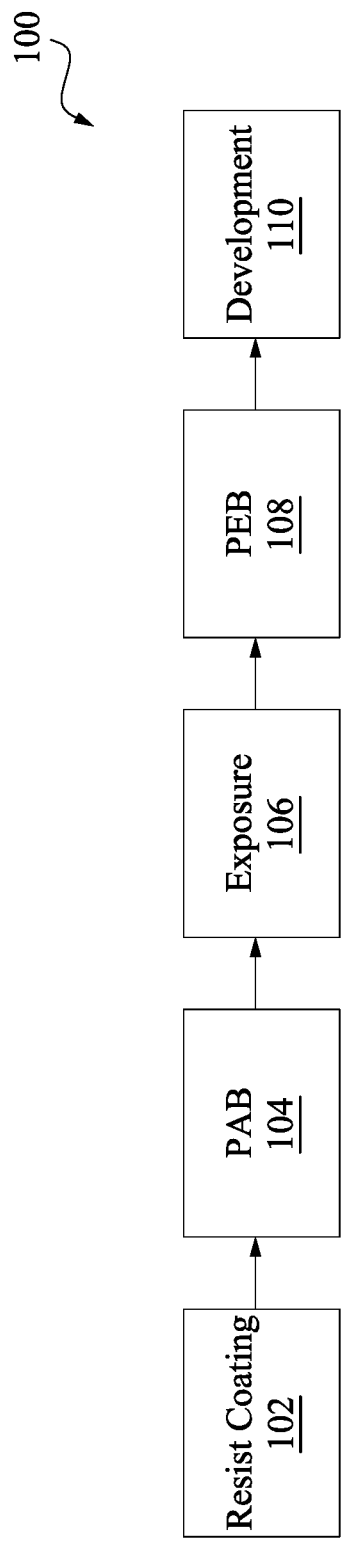
FIG. 1 illustrates an exemplary process for generating a layout pattern in a resist material on a wafer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In some embodiments, a resist material is transferred from a resist supply via a resist pump to be dispensed on a surface of a wafer, e.g., a work piece, to coat the surface of the wafer. In some embodiments, the resist material is a photoresist material that is sensitive to a light energy beam, e.g., deep ultraviolet (DUV) radiation or extreme ultraviolet (EUV) radiation. Then, a DUV imaging system or an EUV imaging system projects a layout pattern to the resist coated surface of the wafer. A subsequent development of the photoresist material after the exposure to DUV or EUV radiation generates the layout pattern in the photoresist material. In some embodiments, the resist material is sensitive to a charged particle beam, e.g., an electron beam, and a charged particle imaging or scanning system projects the layout pattern in the resist coated surface of the wafer. A subsequent development of the resist material after the exposure to the charged particle beam generates the layout pattern in the resist material.

The resist layer 216 is either a positive tone resist or a negative tone resist. A positive tone resist refers to a resist material that when exposed to the charged particle beam or the actinic radiation (typically UV light, e.g., EUV) becomes soluble in a developer, while the region of the resist that is non-exposed (or exposed less) is insoluble in the developer, leaving behind a coating in areas that were not exposed. A negative tone resist, on the other hand, refers to a resist material that when exposed to the charged particle beam or the actinic radiation becomes insoluble in the developer, while the region of the resist that is non-exposed (or exposed less) is soluble in the developer. The region of a negative resist that becomes insoluble upon exposure to radiation may become insoluble due to a cross-linking reaction caused by the exposure to radiation, leaving behind a coating in areas that were exposed.

The layout pattern generated in resist material dispensed on the surface of the wafer defines the critical dimension (CD). An impurity or defect in the resist material may cause the resist material to not react accordingly and thus may generate CD non-uniformity in the layout pattern. In some embodiments and in the case of a positive tone resist material, the defect, e.g., a crystallization of the resist material, may prevent a portion of the resist material under the defect to receive the charged particle beam or the light energy beam. Thus, the portion under the defect may not be dissolved after the application of the developer. Alternatively, the defect may not be altered by the charged particle beam or the light energy beam and, thus, the defect and the portion under the defect may not be dissolved after the application of the developer and create CD non-uniformity. In some embodiments and in the case of a negative tone resist material, the defect may prevent a portion of the resist material under the defect to receive the charged particle beam or the light energy beam. Thus, the portion under the defect may be dissolved after the application of the developer and create CD non-uniformity.

In some embodiments, the resist material stays, motionless, e.g., stationary, in the resist pump system between the resist supply and the dispensing nozzle for a period of time between 1 hour to 24 hours. In some embodiments, the stationary resist material crystalizes and creates defects in the resist material that is in the resist pump system. Thus, in some embodiments, the resist pump system is designed such that the resist material does not stay stationary in the resist pump system and continuously moves from an instance the resist material leaves a resist material supply until the resist material is dispensed on the surface of a wafer.

FIG. 1 illustrates an exemplary process 100 for generating a layout pattern in a resist material on a wafer. In some embodiments, the process 100 is performed by the control system 600 of FIG. 6 or the computer system 900 of FIGS. 9A and 9B. In operation 102, a resist layer is disposed, e.g., coated, on a top surface of a substrate, e.g., a wafer or a work piece. Disposing the resist layer on the top surface of the wafer is described with respect to FIG. 2A. At operation 104, a post application bake (PAB) operation 104 is performed. The wafer including the resist layer are baked to drive out solvent in the resist material and solidify the resist layer on top of the wafer. At operation 106, the exposure operation 106, the resist layer is irradiated with actinic radiation or a charged particle beam to project a mask pattern onto the resist layer. In some embodiments, a layout pattern on a mask is projected by an EUV radiation from an EUV light source onto the resist layer to generate the layout pattern in the resist layer on the wafer. In some embodiments, portions of the resist layer are exposed to an electron beam from an electron beam source to generate the layout pattern in the resist layer on the wafer. At operation 108, a post exposure bake (PEB) operation 108 is performed on the wafer and at operation 110, by applying a developer solution, the resist material of the resist layer is developed. For a positive tone resist material, the exposed regions are developed by applying a developer solution and then are removed and the layout pattern is generated in the resist layer. For a negative tone resist material, the non-exposed regions are developed by applying the developer solution and are subsequently removed and the layout pattern is generated in the resist layer.

Figure 2B:
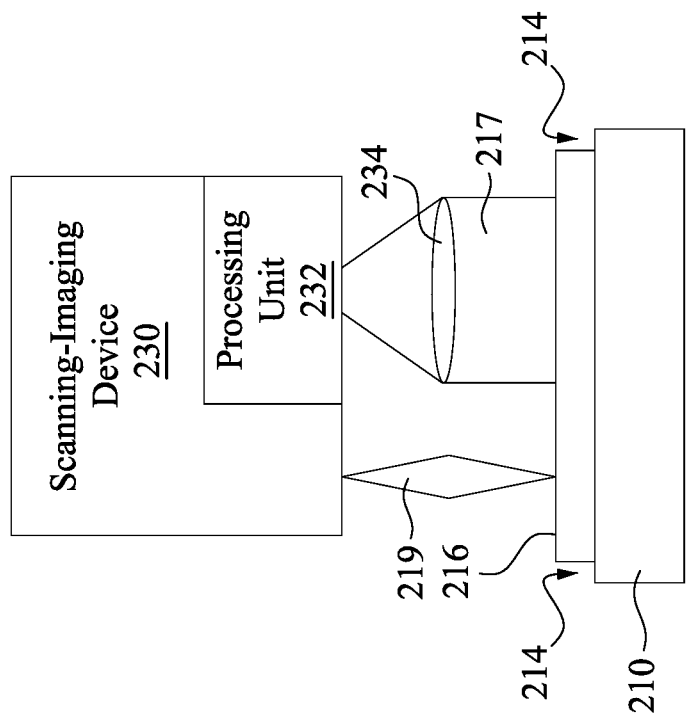
FIGS. 2A and 2B show the operations for dispensing a resist layer on a surface of a wafer and inspecting the resist layer in accordance with some embodiments of the present disclosure.
Figure 2A:
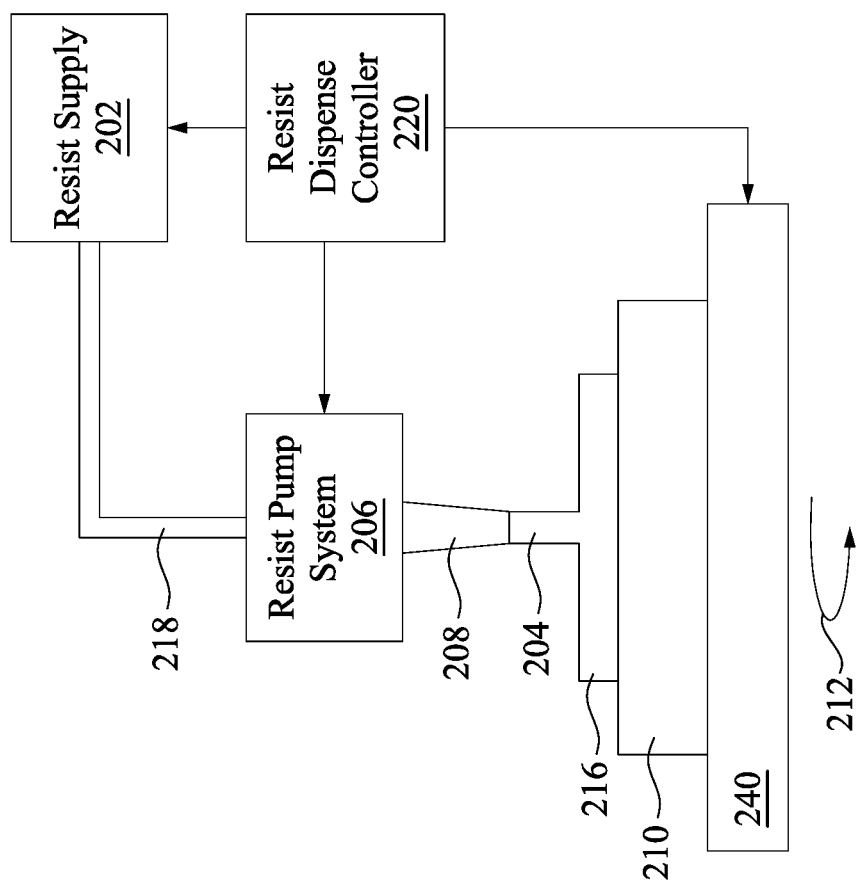

FIGS. 2A and 2B show the operations for dispensing a resist layer 216 on a surface of a wafer and inspecting the resist layer 216 in accordance with some embodiments of the present disclosure. A resist material 204, e.g., a photoresist material, is coated on a surface of a substrate 210, e.g., a wafer, to form the resist layer 216 of FIGS. 2A and 2B. The resist material 204 is dispensed from a resist dispensing nozzle 208. In some embodiments, a resist dispense controller 220 is coupled to a resist pump system 206 to control a thickness of the resist layer 216 that is produced on the substrate 210. The resist pump system 206 that is coupled to the resist dispensing nozzle 208 and transfers the resist material from a resist supply 202, via a pipe 218 (e.g., a conduit, or a tube), to the resist dispensing nozzle 208 is described in more detail with respect to FIGS. 4A and 4B. In some embodiments, the substrate 210 is placed on a stage 240 and the stage 240 rotates around a rotation direction 212 to uniformly distribute the resist material on the substrate 210. In some embodiments, a protection segment (not shown) is coated in an edge region 214 around an edge of the substrate 210 to prevent the resist material from spilling over the edge of the substrate 210. In some embodiments, the resist dispense controller 220 is also coupled to a stage controller (not shown) in the stage 240 to synchronize the dispensing of the resist material and the rotation of the substrate 210. In some embodiments, the substrate 210 is used for manufacturing a semiconductor device and, thus, includes one or more layers of the semiconductor device below the resist layer 216. In some embodiments, the stage 240 rotates around a direction opposite to the rotation direction 212.

In some embodiments, the resist layer 216 is a photosensitive layer that is patterned by exposure to actinic radiation. In some embodiments, the resist layer 216 is sensitive to charged particles and the resist layer 216 is patterned by exposure to a charged particle beam, e.g., an electron beam. The chemical properties of the resist regions struck by actinic radiation or the charged particle beam may change in a manner that depends on the type of resist used. The resist layer 216 is either a positive tone resist or a negative tone resist.

FIG. 2B shows the resist layer 216 on top of the substrate 210. In some embodiments, the substrate 210 including the resist layer 216 are baked, in the PAB operation 104, to drive out solvent in the resist material and solidify the resist layer 216. In some embodiments, operation 108, the PEB operation 108, is performed on the resist layer 216. In addition, FIG. 2B shows a scanning-imaging device 230 that generates a focusing beam 219 for scanning a top surface of the resist layer 216 and generates an image of the top surface of the resist layer 216. Also, FIG. 2B shows the scanning-imaging device 230 and a lens 234 that generates a uniform beam 217 for imaging a top surface of the resist layer 216 and generating the image of the top surface of the resist layer 216 to inspect the top surface of the resist layer 216. In addition, the scanning-imaging device 230 includes a processing unit 232, e.g., an image processing unit, to process the generated image of the top surface of the resist layer 216. In some embodiments, the processing unit 232 performs one or more image processing and/or image recognition algorithms on the generated image of the top surface of the resist layer 216 and determines one or more defects in the generated image. In some embodiments, the processing unit 232 performs a blob analysis and determines the defects of the generated image and ranks the determined defects based on size and severity. In some embodiments, the severity of defects is defined based on the location of the defect such as proximity to critical features of the layout pattern and if the defect causes CD non-uniformity. In some embodiments, the focusing beam 219 and the uniform beam 217 are light beams. In some embodiments, the focusing beam 219 is an electron beam.

FIGS. 3A, 3B, 3C, 3D, and 3E illustrate resist defects on a top surface of a wafer. FIG. 3A shows a substrate 210, e.g., a wafer, with a resist layer 216 on top of the substrate 210. As shown, the resist layer 216 is after the PAB operation 104 or after the PEB operation 108 in some embodiments. The resist layer 216 has a defect 304, which is a void in the resist layer 216. In some embodiments, the resist layer 216 is a portion of the resist material that remains on the wafer for a subsequent process step. The defect 304 is produced because the resist layer 216 included a crystallization defect on top surface of the resist layer and the crystallization defect did not attach to the resist layer 216, creating a void. After the defect 304 is removed and the void is created, the remaining portion of the resist layer 216 under the defect 304 may not have enough thickness to protect the devices under the resist layer 216 in subsequent process steps. Another defect 302 is shown in the resist layer 216, e.g., a crystallization defect. In some embodiments, the resist layer 216 is a portion of a positive tone resist material that is exposed in the exposure operation 106. Because of the defect 302, the resist material under the defect 302 may not receive a sufficient exposure dose and, thus, may not become soluble in the developer. In other embodiments, the resist layer 216 is a portion of a negative tone resist material that is exposed in the exposure operation 106. Because of the defect 302, the negative tone resist material under the defect 302 may not receive a sufficient exposure dose and, thus, may not become insoluble in the developer. In some embodiments, the defect 302 may cause the removal of a portion of the resist layer 216 when the portion should remain; or a portion of the resist layer 216 to remain when the portion should be removed.

FIGS. 3B, 3C, 3D, and 3E illustrate an image captured by the scanning-imaging device 230 of FIG. 2B from a surface of a wafer 310 which is consistent with the substrate 210 of FIG. 2B. In some embodiments, the resist layer 216 is deposited, e.g., coated, on the wafer 310 and the captured image is taken after the PAB operation 104, after the exposure operation 106, or after the PEB operation 108. The captured image is processed and the defects 320, e.g., the crystallization defects 320, on the resist layer 216 are determined. As shown in FIGS. 3B, 3C, 3D, and 3E, the number of defects 320 increases from FIG. 3B to FIG. 3E. In addition, FIGS. 3B, 3C, and 3D have larger defects 320 compared to FIG. 3E, which has the highest number of defects 320. The number of defects may be determined, e.g., calculated as a total number of defects on a wafer or as a map of the number of defects in a unit area, e.g., in each square millimeter of the wafer surface.

Figure 4A:
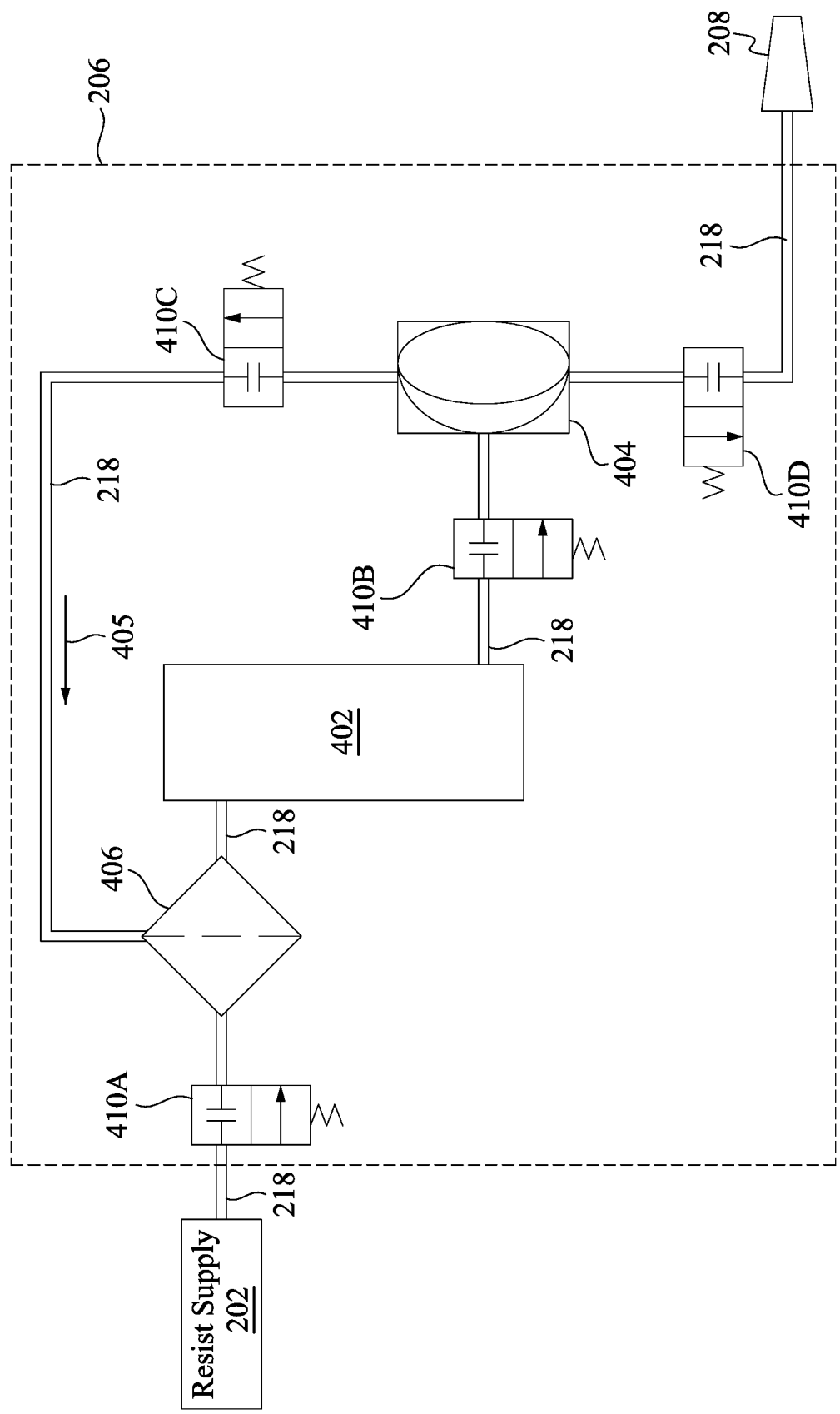
FIGS. 4A and 4B illustrate resist pump systems for dispensing a resist material from a resist supply to a dispensing nozzle in accordance with some embodiments of the present disclosure.
Figure 4B:
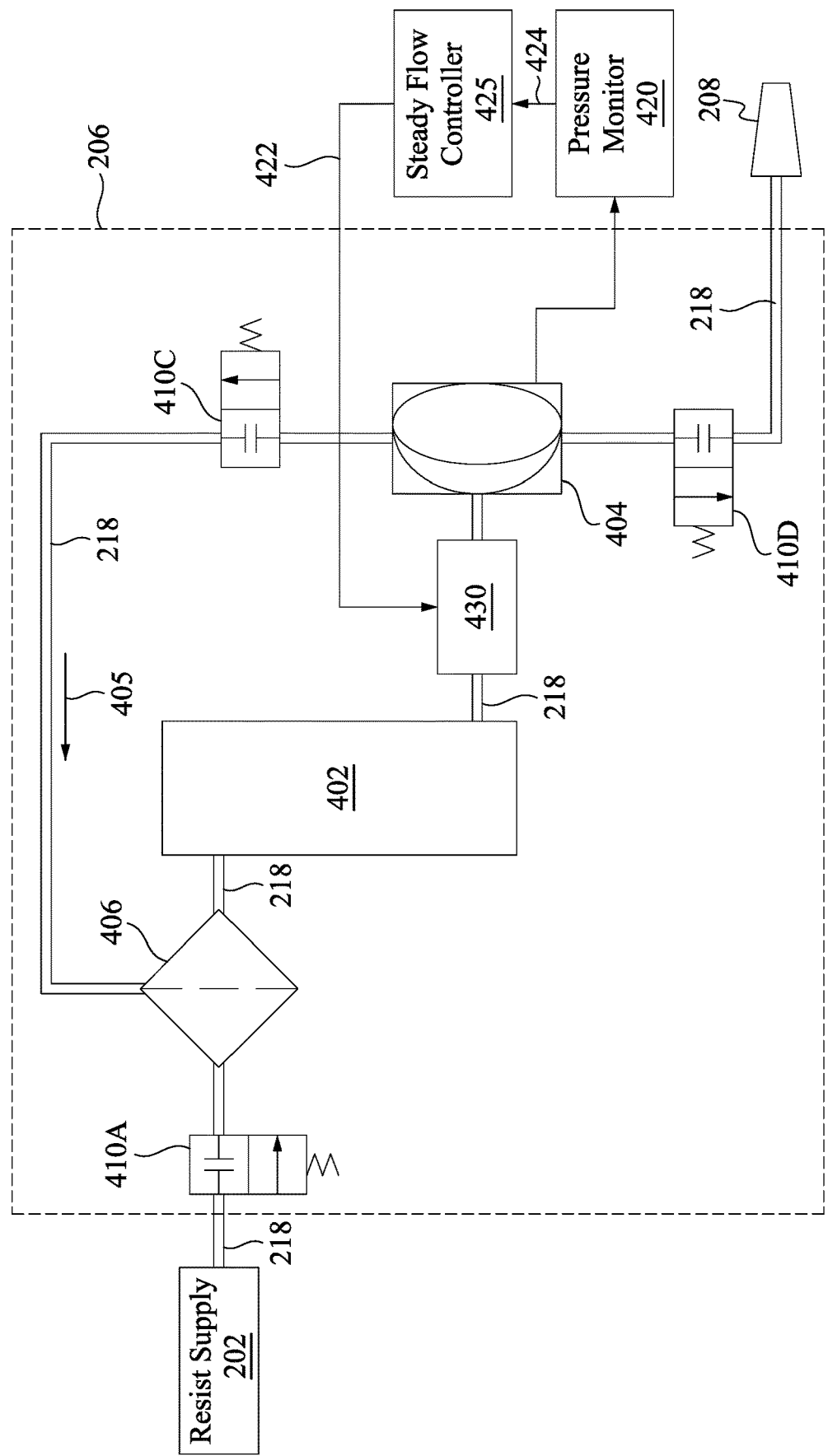

FIGS. 4A and 4B illustrate resist pump systems for dispensing a resist material from a resist supply to a dispensing nozzle in accordance with some embodiments of the present disclosure. FIG. 4A shows the resist pump system 206 of FIG. 2A, which is connected via the pipe 218 to the resist supply 202 to receive the resist material. In addition, the resist pump system 206 provides the resist material to the resist dispensing nozzle 208. The resist supply 202 is connected through a valve, e.g., an open/close valve 410A, to a resist filter 406; and the resist filter 406 is connected to a resist tank structure 402, e.g., a resist buffer tank, via the pipe 218. The resist tank structure 402 is also connected via the pipe 218 and a valve, e.g., an open/close valve 410B, to the resist pump device 404. The resist pump device 404 is connected via the pipe 218 and a valve, e.g., an open/close valve 410D, to the resist dispensing nozzle 208. Also, the resist pump device 404 is connected via the pipe 218 and a valve, e.g., an open/close valve 410C, back to the resist filter 406.

In some embodiments, when the valve 410B is open, the resist pump device 404 draws the resist material from the resist tank structure 402 and the resist pump device 404 pushes the resist material to the resist dispensing nozzle 208 when the valve 410D is open. In some embodiments as shown in FIG. 2A, the resist dispensing nozzle 208 dispenses the resist material on a wafer. In some embodiments, at least a portion of the resist material drawn from the resist tank structure 402 is pushed through the pipe 218 and the valve 410C back to the resist filter 406.

In some embodiments, at least one of a first pair of valves 410B and 410D or a second pair of valves 410B and 410C are open and the resist pump device 404 draws the resist material from the resist tank structure 402 and pushes the resist material to the resist dispensing nozzle 208 and/or pushes the resist material back to the resist filter 406. In some embodiments, the resist material does not stay stationary in the resist pump system 206 and continuously flows and the resist material is continuously circulated and/or is dispensed. In some embodiments, the resist pump device 404 stays continuously on such that the resist material does not stay stationary in the resist tank structure 402, the resist filter 406, the resist pump device 404, or the pipes. In some embodiments, the resist material flow includes a circulation flow 405 of the resist material in the resist pump system 206 and the flow of the resist material between the resist supply 202 to the resist dispensing nozzle 208 is a laminar flow and, thus, no bubbles are generated in the resist pump system 206.

FIG. 4B also shows the resist pump system 206, which is connected via the pipe 218 to the resist supply 202 and transfers the resist material via the pipe 218 to the resist dispensing nozzle 208. The resist pump system 206 of FIG. 4B includes an adjustable valve 430 instead of the open/close valve 410B of FIG. 4A. In some embodiments, a flow of the resist material in the adjustable valve 430 is controlled by applying one or more signals, e.g., voltages, to one or more input ports of the adjustable valve 430. The adjustable valve 430 is described with respect to FIG. 4D. FIG. 4B also includes a pressure monitor 420 connected to or included in the resist pump device 404. The pressure monitor 420 monitors the pressure in the pipe 218 where the pipe 218 enters the resist pump device 404 and also monitors the pressure in the pipes 218 where the pipes 218 leave the resist pump device 404 to either of the open/close valves 410D and 410C. The pressure monitor 420 generates pressure signals 424 based on the monitored pressures. The pressure monitor 420 transfers the pressure signals 424 to a steady flow controller 425 that is coupled to the pressure monitor 420. The steady flow controller 425 uses the pressure signals 424 and generates control signals 422, e.g., control voltages, based on the pressure signals 424 for the one or more input ports of the adjustable valve 430 to control the flow of the resist material in the adjustable valve 430. In some embodiments, the resist filter 406 removes the defects, e.g., crystallization defects, of the resist material and send a filtered resist material via the pipe 218 to the resist tank structure 402. In some embodiments, the resist material that is circulated back from the pump device 404 via the pipe 218 and open/close valve 410C to the resist filter 406, is filtered by the resist filter 406 and the defects are removed. In some embodiments, the adjustable valve 430 is a steady flow valve that is adjusted to generate a steady flow of the resist material in the resist pump system 206.

Figure 4D:
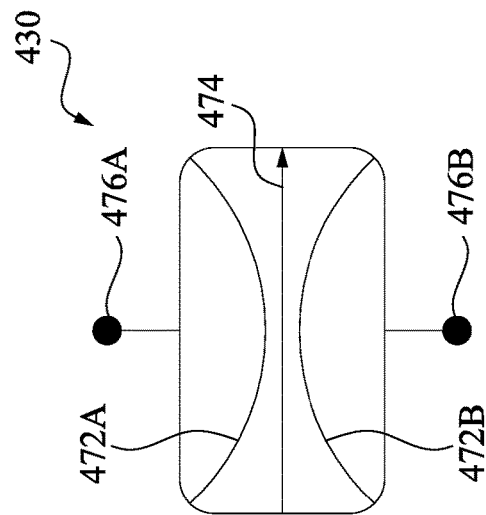
FIGS. 4C and 4D respectively illustrate a resist tank structure and an exemplary controllable valve of the resist pump systems in accordance with some embodiments of the present disclosure.
Figure 4C:
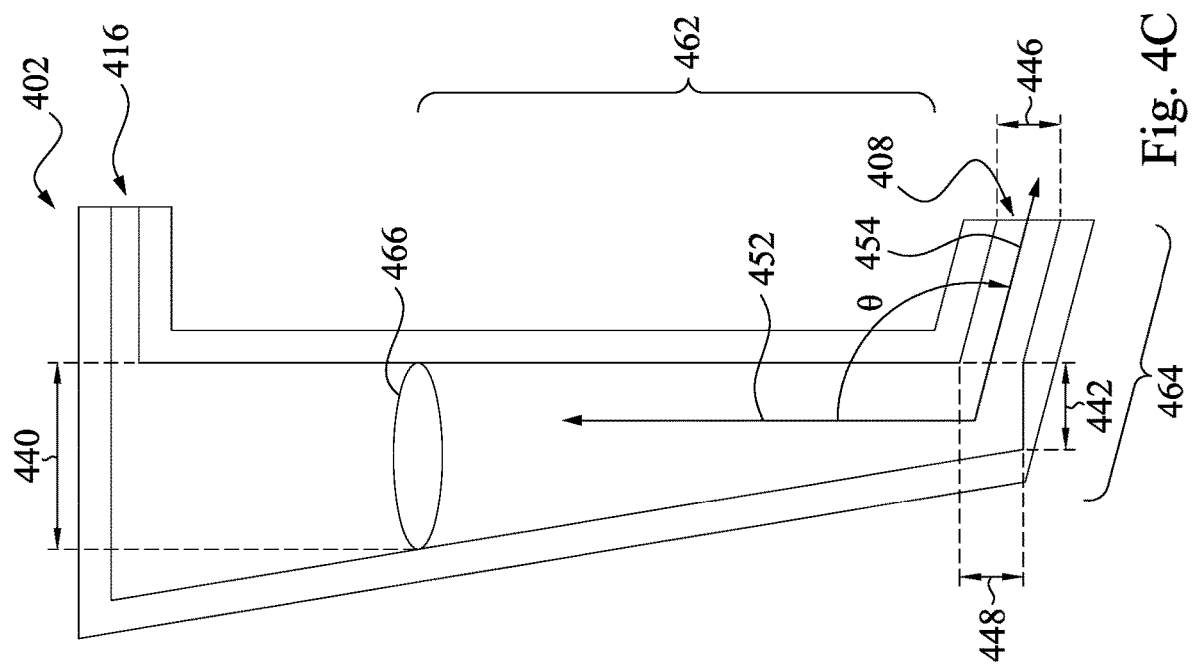

FIGS. 4C and 4D respectively illustrate a resist tank structure 402 and an exemplary controllable valve 430 of the resist pump system 206 in accordance with some embodiments of the present disclosure. The resist tank structure 402 of FIG. 4C includes a first tank 462, e.g., tank A (also referred to as upper tank), extending in a direction 452 and a second tank 464, e.g., tank B (also referred to as lower tank), extending in a direction 454 such that the directions 452 and 454 have an angle $\ominus$ greater than 90 degrees. In some embodiments, the angle $\ominus$ is more than 90 degrees but is less than 180 degrees. In some embodiments, the angle $\ominus$ is between 90 degrees and 135 degrees. In some embodiments, the angle $\ominus$ is between 90 degrees and 270 degrees. The first tank 462 has a first diameter 440 at a first end defined by an ellipse 466 that is an entrance to the first tank 462 and a second diameter 442 at a second end. In some embodiments, the first tank is vertically oriented such the direction 452 is from bottom to top and the first end is a top end and the second end is a bottom end, and, thus, the top end has the first diameter 440 and the bottom end has the second diameter 442. In some embodiments, the first diameter 440 is larger than the second diameter 442. The second tank 464 has a first diameter 448 at a first end that is coupled to the second end of the first tank 462 and a second diameter 446 at a second end. In some embodiments, the first diameter 448 is larger than or equal to the second diameter 446. In some embodiments, the resist material enters the resist tank structure 402 from an opening 416 and exits the resist tank structure 402 from an opening 408. In some embodiments, the diameters 440, 442, 446, and 448 and the angle $\ominus$ is designed such that when resist material enters resist tank structure 402 from the opening 416 and leaves, e.g., exits, the resist tank structure 402 from the opening 408, there is a continuous flow in every portion of the resist tank structure 402 and the resist material is not stationary in the resist tank structure 402 and, thus, crystallization of the resist material is avoided.

As shown, the adjustable valve 430 of FIG. 4D has an adjustable membrane 472A and an adjustable membrane 472B defining a passage for the resist material when the resist material is moving in a direction 474 in the adjustable valve 430. The adjustable valve 430 also includes a first input port 476A and a second input port 476B for exerting adjustable control voltages, based on the pressure signals 424, to control a flow rate of the adjustable valve 430. In some embodiments, the pressure in the pipe 218 that leaves the resist pump device 404 to the open/close valve 410D indicates that the open/close valve 410D is open and the resist material is being dispensed on a wafer. Then, the control voltages at the input ports 476A and/or 476B control the adjustable membranes 472A and 472B to make the passage of the adjustable valve 430 wider such that the flow inside the adjustable valve 430 in the direction 474 increases. In some embodiments, the pressure in the pipe 218 that leaves the resist pump device 404 to the open/close valve 410D indicates that the open/close valve 410D is closed and the resist material is not dispensed on a wafer. Then, the control voltages at the input ports 476A and/or 476B control the adjustable membranes 472A and 472B to narrow the passage of the adjustable valve 430 such that the flow inside the adjustable valve 430 in the direction 474 decreases. In some embodiments, the pressure in the pipe 218 leaving the resist pump device 404 to the open/close valve 410D indicates that the open/close valve 410D is closed and the pressure in the pipe 218 leaving the resist pump device 404 to the open/close valve 410C indicates that the circulation flow 405 is below a threshold level that can generate crystallization in the resist pump system 206. Then, the control voltages at the input ports 476A and/or 476B control the adjustable membranes 472A and 472B to widen passage of the adjustable valve 430 wider such that the flow inside the adjustable valve 430 in the direction 474 increases and, thus, the circulation flow 405 from the resist pump device 404 to the resist filter 406 increases and crystallization of the resist material is avoided.

Figure 5:
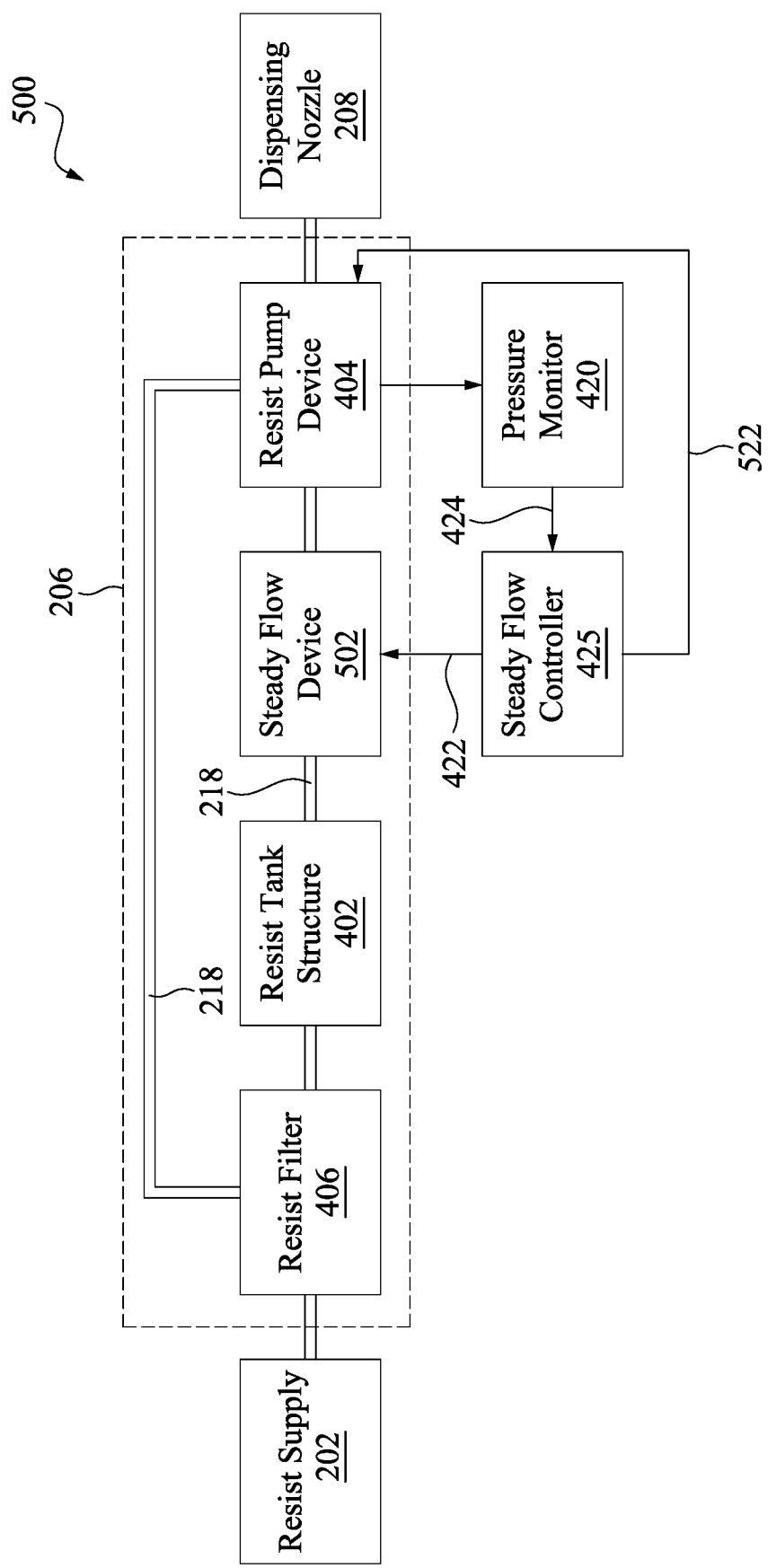
FIG. 5 illustrates a diagram of an exemplary resist dispensing system in accordance with some embodiments of the present disclosure

FIG. 5 illustrates a diagram of an exemplary resist dispensing system 500 in accordance with some embodiments of the present disclosure. As shown in FIG. 5, the resist dispensing system 500 includes the resist supply 202 connected via the pipe 218 to the resist filter 406 and the resist filter 406 is connected via the pipe 218 to the resist tank structure 402. As, the resist material is drawn from the resist supply 202, the defects in the resist material are removed by the resist filter 406, and the filtered resist material is transferred to the resist tank structure 402. The resist dispensing system 500 further includes a steady flow device 502, e.g., a steady flow valve, and a resist pump device 404. The resist pump device 404 is connected through the pipe 218 and via the steady flow device 502 to the resist tank structure 402. In some embodiments, the resist pump device 404 draws the resist material from resist tank structure 402 and pushes the resist material through the pipe 218 to the resist dispensing nozzle 208 that is located downstream from the resist pump device 404. In some embodiments, in response to drawing the resist material by the resist pump device 404 from the resist tank structure 402, the resist tank structure 402 draws the resist material through the resist filter 406 from the resist supply 202.

As shown in FIG. 5, the resist pump device 404 also circulates via the pipe 218, at least a portion of the resist material that is not transferred to the resist dispensing nozzle 208 back to the resist filter 406. The steady flow device 502 that is consistent with the adjustable valve 430 of FIG. 4B and is used to create a steady flow, e. g., a continuous flow, of the resist material at least in the resist pump system 206 portion of the resist dispensing system 500. The continuous flow of the resist material prevents the crystallization of the resist material in the resist pump system 206 in some embodiments. The resist dispensing system 500 also includes the pressure monitor 420 and the steady flow controller 425. As described, the pressure monitor 420 generates pressure signals 424 and transfers the pressure signals 424 to the steady flow controller 425 that is coupled to the pressure monitor 420. The steady flow controller 425 generates one or more control signals 422, e.g., control voltages, based on the pressure signals 424 for the steady flow device 502. By applying the control signals 422 to the steady flow device 502, the flow of the resist material in the steady flow device 502 is adjusted. In addition, the steady flow controller 425 generates one or more control signals 522, e.g., control voltages, based on the pressure signals 424 for the resist pump device 404. By applying the control signals 522 to the resist pump device 404, the circulation flow 405 of the resist material to the resist filter 406 is adjusted and crystallization of the resist material is avoided.

Figure 6:
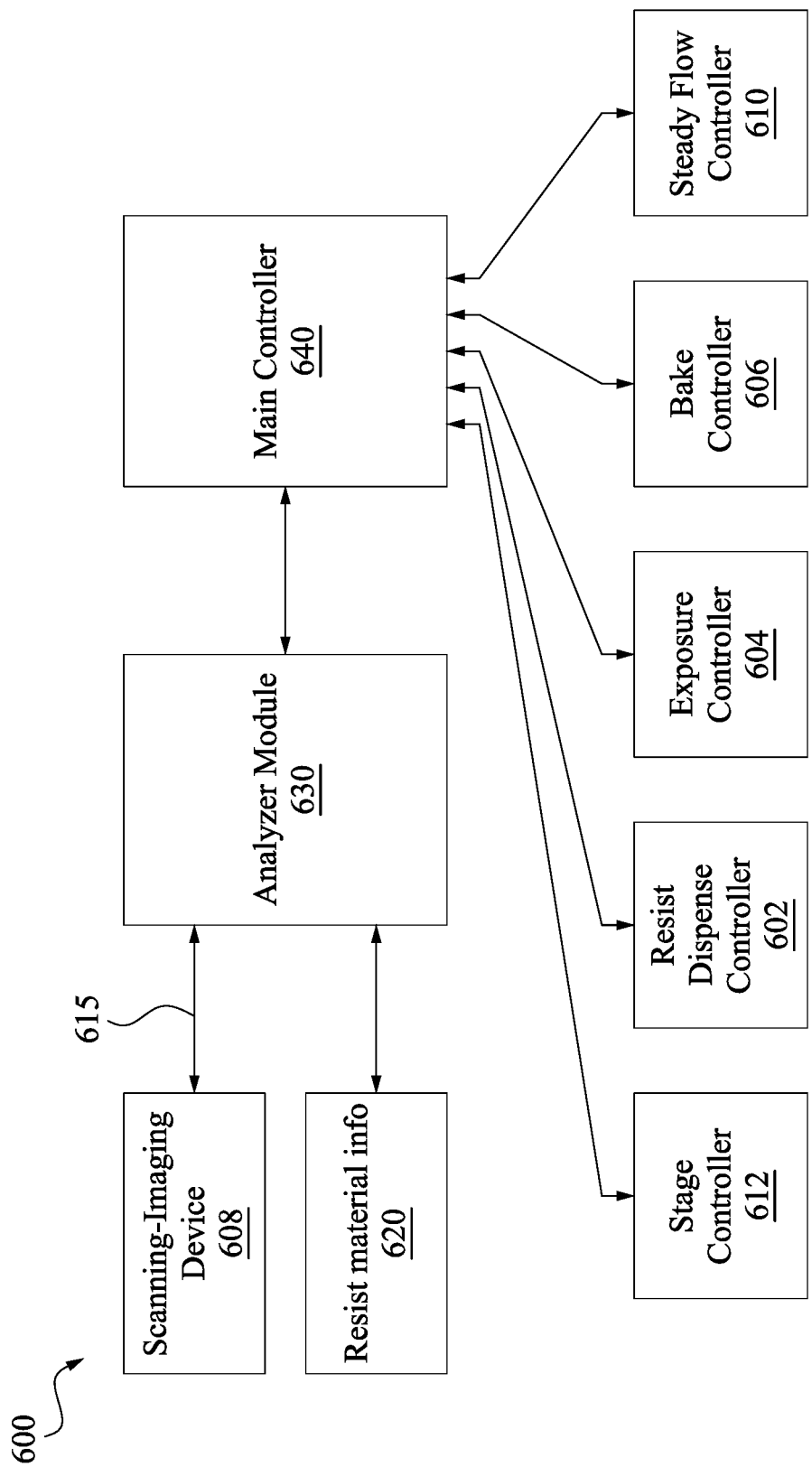
FIG. 6 shows a control system for controlling a resist dispensing system in accordance with some embodiments of the present disclosure.

FIG. 6 shows a control system for controlling a resist dispensing system in accordance with some embodiments of the present disclosure. The control system 600 includes an analyzer module 630 and a main controller 640 coupled to each other. The analyzer module 630 is coupled to a scanning-imaging device 608 and may receive information of the defects of a resist layer, e.g., information 615 of the defects on top surface of the resist layer 216 of FIG. 3B, 3C, 3D or 3E. A scanning-imaging device 608 that is consistent with the scanning-imaging device 230 of FIG. 2B may generate a map of the defects on the surface of the resist layer 216 of FIG. 3B, 3C, 3D or 3E. In some embodiments, the analyzer module 630 also receives information about the resist material, e.g., the resist material information 620. The analyzer may extract, from the resist material information 620, a type of the resist material such as a positive tone resist material or a negative tone resist material and an energy density that should be delivered to the resist material to fully expose the resist material.

In some embodiments, the main controller 640 is coupled to a resist dispense controller 602, an exposure controller 604, a steady flow controller 610, a bake controller 606, and a stage controller 612. In some embodiments and returning back to FIG. 2A, the resist dispense controller 602 is consistent with the resist dispense controller 220 and the stage controller 612 is included in the stage 240. In some embodiments, the steady flow controller 610 is consistent with the steady flow controller 425 of FIGS. 4B and 5. In some embodiments and based on the information 615 of the defects, the analyzer module 630 may generate a density of the defects on the surface of the resist layer 216 and may assign a severity score to the defects of the resist layer 216. In some embodiments and based on the severity score, the analyzer module 630 sends a command via the main controller 640 to the steady flow controller 610 to adjust the flow of the resist material in the resist pump system 206. In some embodiments, the analyzer module 630 sends a command via the main controller 640 to the steady flow controller 610 to increase the flow of the resist material through the steady flow device 502 and also sends a command to the resist pump device 404 to increase the circulation flow 405 of the resist material back to the resist filter 406.

In some embodiments, the analyzer module 630 determines, based on the resist material info 620, an amount of time and temperature to heat the substrate, e.g., for the PAB operation 104 or the PEB operation 108. The analyzer module 630 commands the bake controller 606 through the main controller 640 to perform the PAB operation or the PEB operation. In some embodiments, the analyzer module 630 determines, based on the resist material info 620, an amount of energy to fully expose the resist material to produce a layout pattern in the resist material. The analyzer module 630 commands the exposure controller 604 through the main controller 640 to turn on a radiation source (not shown) to expose the resist layer 216 to the radiation.

Figure 7:
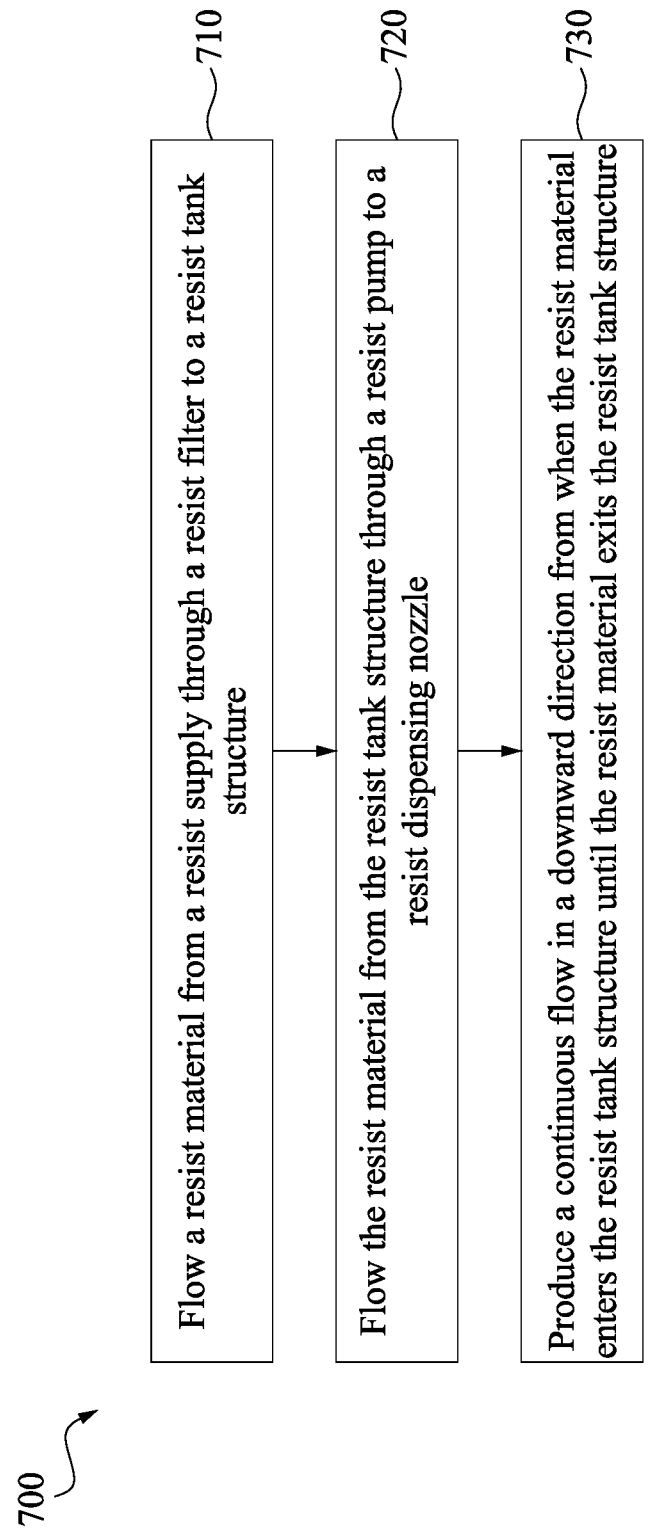
FIG. 7 illustrates a flow diagram of an exemplary process for controlling a resist dispensing system some in accordance with some embodiments of the present disclosure.

FIG. 7 illustrates a flow diagram of an exemplary process 700 for controlling a resist dispensing system some in accordance with some embodiments of the present disclosure. In some embodiments, the process 700 is performed by the control system 600 of FIG. 6 or the computer system 900 of FIGS. 9A and 9B. In operation 710, a flow of a resist material from a resist supply through a resist filter to a resist tank structure is produced. In some embodiments and as shown in FIG. 5, a flow of the resist material from the resist supply 202 through the resist filter 406 to the resist tank structure 402 is produced. In some embodiments, the flow is produced by the resist pump device 404 and the flow occurs in the pipe 218.

At operation 720, a flow of the resist material from the resist tank structure through a resist pump to a resist dispensing nozzle is produced. In some embodiments and as shown in FIG. 5, the flow of the resist material from the resist tank structure 402 through the resist pump device 404 to the resist dispensing nozzle 208 is produced. In some embodiments, the flow is produced by the resist pump device 404 and the flow occurs in the pipe 218.

At operation 730, a continuous flow is produced from when the resist material enters the resist buffer thank until the resist material exits the resist tank structure. In some embodiments as shown in FIG. 4C, the flow of the resist material from when the resist material enters the resist tank structure 402 through the opening 416, until the resist material exits the resist tank structure 402 through the opening 408 is a continuous flow, e.g., a steady flow.

Figure 8A:
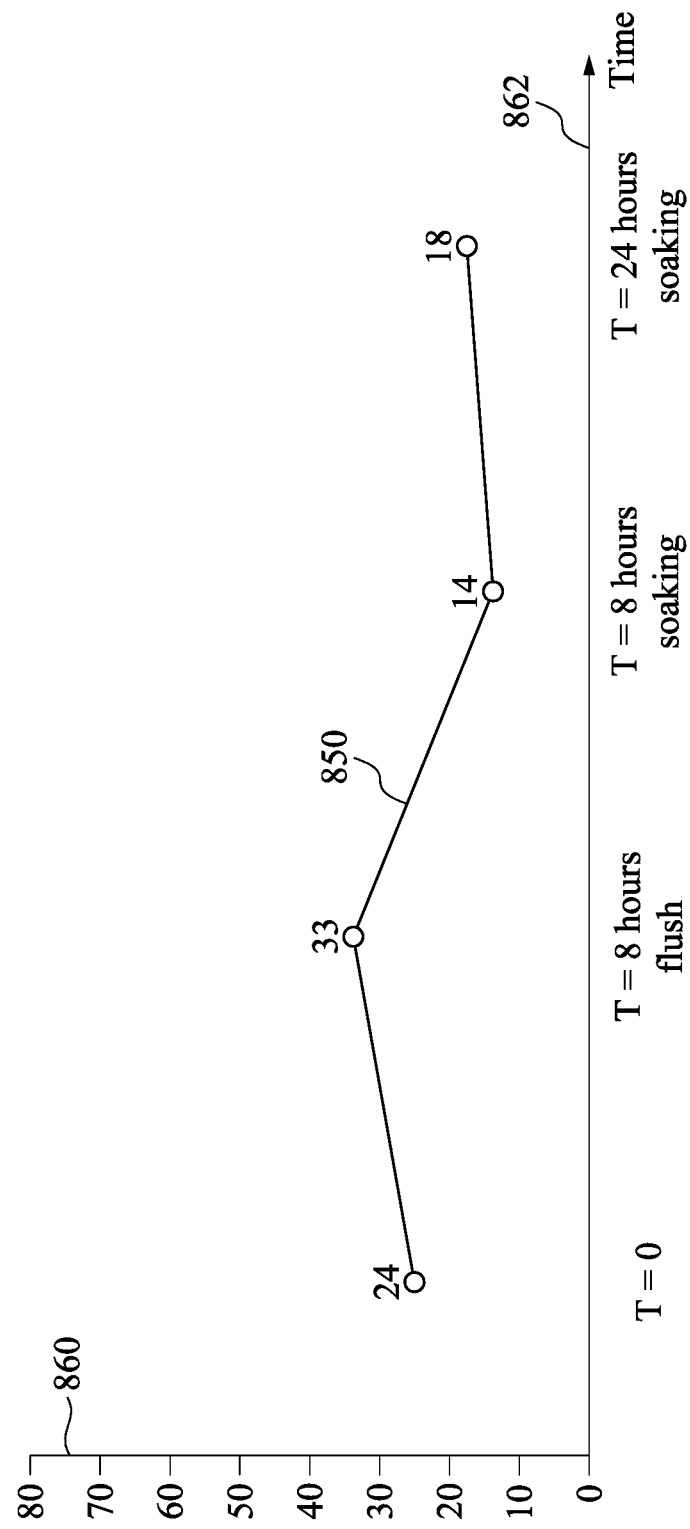
FIGS. 8A, 8B, and 8C illustrate the number of resist defects in the resist material dispensed on a wafer per an amount of time the resist material stays in the resist pump system.
Figure 8B:
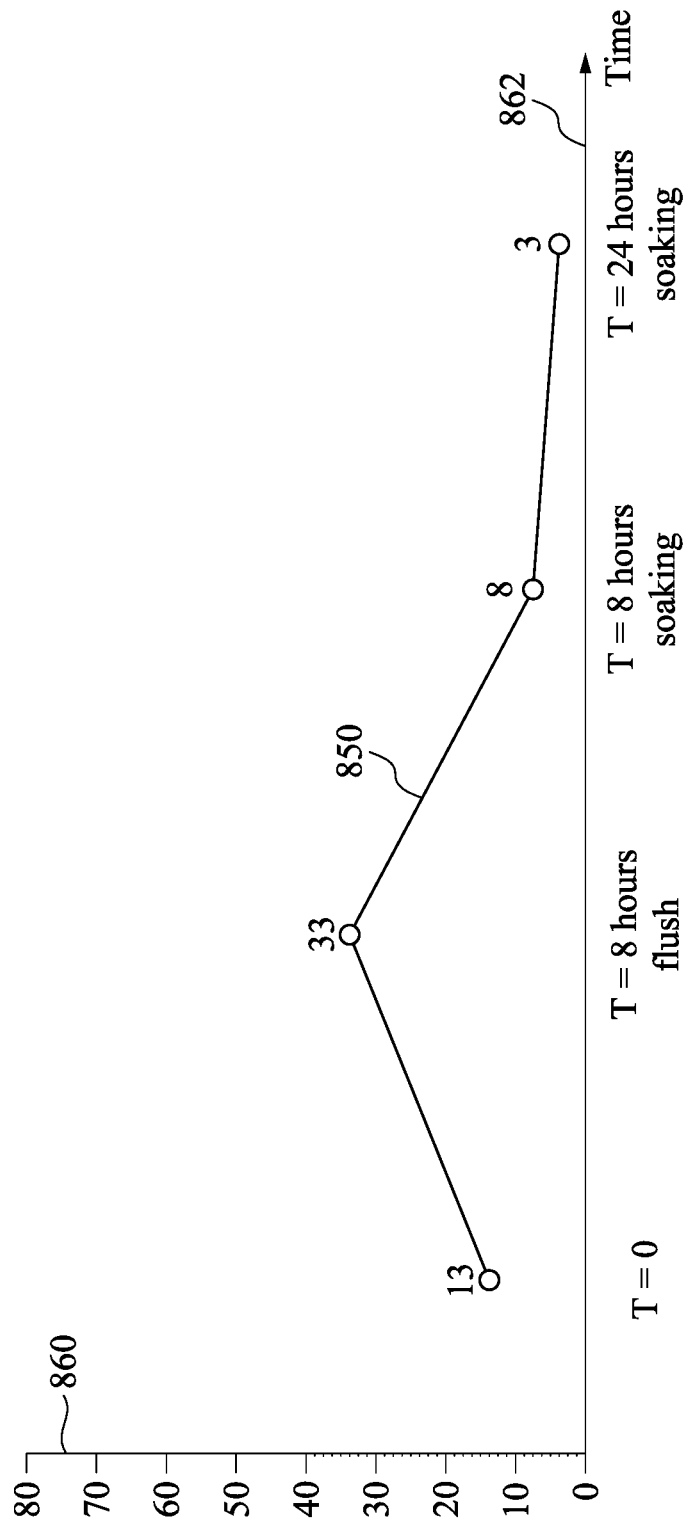
Figure 8C:
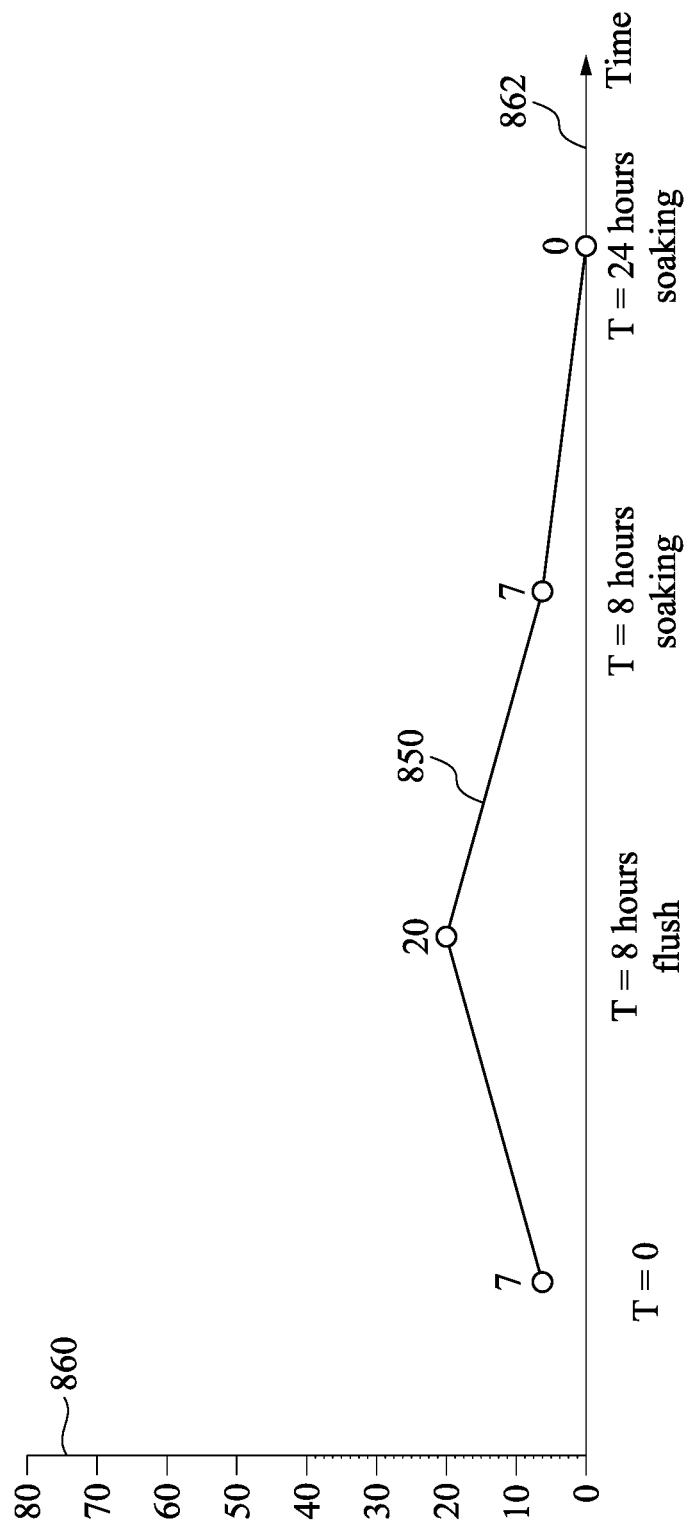

FIGS. 8A, 8B, and 8C illustrate the number of resist defects in the resist material dispensed on a wafer per an amount of time the resist material stays in the resist pump system 206 of FIGS. 2A, 4A, 4B, and 5. A coordinate 860 of FIGS. 8A, 8B, and 8C shows the number of defects observed by, for example, the scanning-imaging device 230 of FIG. 2. In some embodiments the number of defects is determined per unit area. In some embodiments, the defects are observed after the PAB operation 104 or after the PEB operation 108. A coordinate 862 of the FIGS. 8A, 8B, and 8C shows a time duration after the resist material has entered a resist pump system, e.g., the resist pump system 206 of FIGS. 2A, 4A, and 4B.

In some embodiments, a graph 850 of FIGS. 8A, 8B, and 8C shows the number of observed defects at time zero, T=0, when resist material is initially drawn from the resist supply to the resist tank structure 402 and is deposited on a wafer with no delay. The graph 850 also shows the number of observed defects after 8 hours of flush, e.g., after 8 hours of continuous deposition of the resist material on the wafers. The graph 850 also shows the number of observed defects after 8 hours and 24 hours of soaking, e.g., after 8 hours and 24 hours of circulating the resist material without dispensing. In FIG. 8A, the first tank 462 is vertically oriented and the diameter 440 of the bottom end of the first tank 462 equals the diameter 442 of the bottom end of the first tank 462 and the angle ⊖ between the first tank 462 and the second tank 464 is 90 degrees. In FIG. 8B, the first tank 462 is vertically oriented and the diameter 440 of the top end of the first tank 462 is larger than the diameter 442 of the bottom end of the first tank 462 and the angle ⊖ between the first tank 462 and the second tank 464 is 90 degrees. In FIG. 8C, the first tank 462 is vertically oriented and the diameter 440 of the bottom end of the first tank 462 is larger than the diameter 442 of the bottom end of the first tank 462 and the angle ⊖ between the first tank 462 and the second tank 464 is 95 degrees. In some embodiments, the numbers on the graph 850 of FIGS. 8A, 8B, and 8C show the number of defects. As shown in FIGS. 8A, 8B, and 8C, the steady flow with no portion of the resist material being idle, flowing the resist material in a tank structure 402 having a smaller bottom end diameter compared to the top end diameter for the first tank 462, and having an angle ⊖ greater than 90 degrees between the first tank 462 and the second tank 464 reduces the number of defects in the resist material. In some embodiments, the defects having at least a threshold size, e.g., a width, a length, and/or a diameter, are detected and smaller defects are not detected. In some embodiments, the threshold size is between about nm and about 20 nm. FIGS. 8A, 8B, and 8C show the number of defects having at least a size of 19 nm.

Figure 9B:
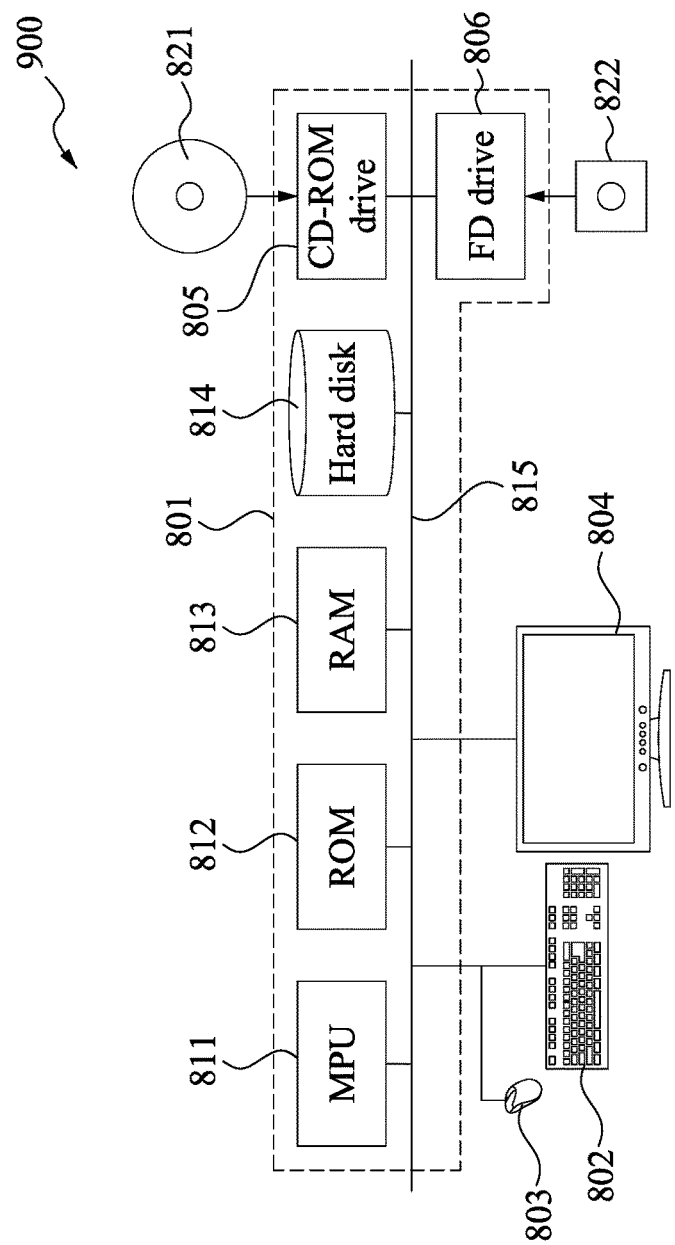
FIGS. 9A and 9B illustrate an apparatus for controlling a resist dispensing system in accordance with some embodiments of the present disclosure.
Figure 9A:
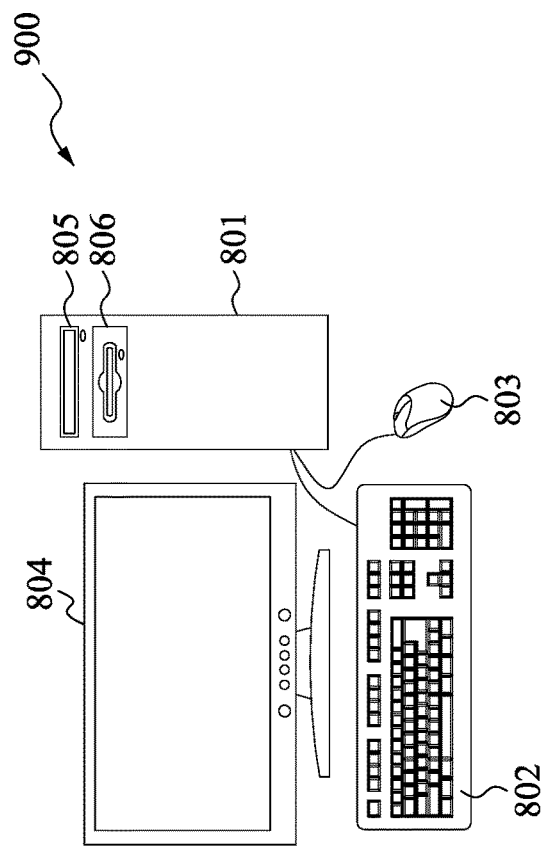

FIGS. 9A and 9B illustrate an apparatus for controlling a resist dispensing system in accordance with some embodiments of the present disclosure. In some embodiments, the computer system 900 is used for performing the functions of the modules of FIG. 6 that include the main controller 640, the analyzer module 630, the stage controller 612, resist dispense controller 602, the exposure controller 604, the bake controller 606, and the steady flow controller 610. In some embodiments, the computer system 900 is used to execute the process 700 of FIG. 7. In some embodiments, the computer system 900 controls a resist dispensing system. In addition, the computer system 900 controls heating the substrate, exposing the substrate to radiation, and scanning or imaging the substrate.

FIG. 9A is a schematic view of a computer system that performs the functions of an apparatus for controlling the dispensing of the resist material on a substrate. All of or a part of the processes, method and/or operations of the foregoing embodiments can be realized using computer hardware and computer programs executed thereon. In FIG. 9A, a computer system 900 is provided with a computer 801 including an optical disk read only memory (e.g., CD-ROM or DVD-ROM) drive 805 and a magnetic disk drive 806, a keyboard 802, a mouse 803, and a monitor 804.

FIG. 9B is a diagram showing an internal configuration of the computer system 900. In FIG. 9B, the computer 801 is provided with, in addition to the optical disk read only memory drive 805 and the magnetic disk drive 806, one or more processors 811, such as a micro processing unit (MPU), a ROM 812 in which a program such as a boot up program is stored, a random access memory (RAM) 813 that is connected to the MPU 811 and in which a command of an application program is temporarily stored and a temporary storage area is provided, a hard disk 814 in which an application program, a system program, and data are stored, and a bus 815 that connects the MPU 811, the ROM 812, and the like. Note that the computer 801 may include a network card (not shown) for providing a connection to a LAN.

The program for causing the computer system 900 to execute the functions of the control system for controlling the dispensing of the resist material on a substrate in the foregoing embodiments may be stored in an optical disk 821 or a magnetic disk 822, which are inserted into the optical disk drive 805 or the magnetic disk drive 806, and transmitted to the hard disk 814. Alternatively, the program may be transmitted via a network (not shown) to the computer 801 and stored in the hard disk 814. At the time of execution, the program is loaded into the RAM 813. The program may be loaded from the optical disk 821 or the magnetic disk 822, or directly from a network. The program does not necessarily have to include, for example, an operating system (OS) or a third party program to cause the computer 801 to execute the functions of the control system for controlling an amount of energy delivered by an electron beam to a resist material in the foregoing embodiments. The program may only include a command portion to call an appropriate function (module) in a controlled mode and obtain desired results.

As discussed, the embodiments above prevent the resist material from being stationary in the resist pump system and prevent the crystallization of the resist material. The resist material in the resist pump system is in steady, continuous motion and no portion of the resist material is idle. Thus, the steady flow prevents the resist material to crystallize. In addition, a resist tank having a smaller bottom end diameter compared to the top end diameter for the first tank, and having an angle ⊖ greater than 90 degrees between the first tank and the second tank reduces the number of defects in the resist material.

According to some embodiments of the present disclosure, a method of dispensing a resist material includes flowing the resist material from a resist supply through a resist filter to a resist tank structure. The method also includes flowing the resist material from the resist tank structure through a resist pump device to a resist dispensing nozzle. The method further includes producing a continuous flow of the resist material from when the resist material enters the resist tank structure until the resist material exits the resist tank structure. In an embodiment, the method further includes producing a laminar flow of the resist material from the resist supply to the resist dispensing nozzle, wherein no bubbles are generated by the laminar flow. In an embodiment, the method further includes generating a circulating flow by directing a portion of resist material from the resist pump device back to the resist filter. In an embodiment, a steady flow device is arranged between the resist tank structure and the resist pump device and the method further includes producing the continuous flow by controlling the flow of the resist material through the steady flow device. In an embodiment, the method further includes dispensing the resist material through the resist dispensing nozzle on a wafer, producing an image of the resist material on the wafer, detecting a number of defects per unit area of the resist material on the wafer, and adjusting the continuous flow based on the detected number of defects.

According to some embodiments of the present disclosure, a method of dispensing a resist material includes flowing the resist material from a resist supply through a resist filter to a resist tank structure. The method also includes flowing the resist material from the resist tank structure through a resist pump device to a resist dispensing nozzle. The method further includes dispensing a first portion of the resist material through the resist dispensing nozzle on the wafer. The method includes generating a circulating flow by directing a second portion of the resist material from the resist pump device back to the resist filter. The method further includes continuously flowing the resist material from when the resist material leaves the resist supply until the resist material is dispensed on the wafer. In an embodiment, the method further includes producing the continuous flow for a second portion of the resist material. In an embodiment, the method further includes producing a laminar flow from when the resist material leaves the resist supply until the resist material is dispensed on the wafer so that no bubbles are generated by the laminar flow. In an embodiment, the method further includes receiving a number of defects per unit area of the resist material on the wafer and adjusting the continuous flow based on the number of defects.

According to some embodiments of the present disclosure, a resist material dispensing system includes a resist supply and a resist filter connected to the resist supply downstream from the resist supply. The dispensing system also includes a resist tank structure connected to the resist filter downstream from the resist filter and a resist pump device connected to the resist tank structure downstream from the resist tank structure. The resist tank structure is vertically arranged so that a resist material flows in a continuous downward flow from where the resist material enters the resist tank structure until the resist material exits the resist tank structure. In an embodiment, the dispensing system further includes a dispensing nozzle connected to the resist pump device downstream from the resist pump device to dispense a first portion of the resist material that exits the resist tank structure on a surface of a wafer. In an embodiment, the dispensing system further includes a piece of conduit connected between the resist pump device and the resist filter and a second portion of the resist material that exits the resist tank structure is sent by the resist pump device through the piece of conduit back to the resist filter. In an embodiment, the resist tank structure includes a first tank and a second tank such that a flow path of the resist material inside the resist tank structure is substantially L-shaped. In an embodiment, the system maintains the resist material in constant motion in the resist tank structure. In an embodiment, the resist tank structure includes a substantially vertically oriented upper tank and a lower tank oriented at angle $\theta$ to the upper tank where $90°\leq\theta\leq270°$. In an embodiment, an internal portion of the vertically oriented upper tank is tapered such that an internal width of the upper tank at an upper tank inlet is greater than an internal width of the upper tank at an upper tank outlet. In an embodiment, an internal width of the lower tank at a lower tank inlet is greater than or equal to an internal width of the lower tank at the lower tank outlet.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of dispensing a resist material, comprising:
   flowing the resist material from a resist supply through a resist filter to a substantially L-shaped resist tank structure;
   flowing the resist material from the resist tank structure through a resist pump device to a resist nozzle; and
   producing a continuous flow of the resist material from when the resist material enters the resist tank structure until the resist material exits the resist tank structure, wherein the resist tank structure comprises a substantially vertically oriented and taper-shaped upper tank and a taper-shaped lower tank connected and oriented at angle $\theta$ to the upper tank where $90°<\theta<135°$, wherein an internal width of the upper tank at an upper tank inlet is greater than an internal width of the upper tank at an upper tank outlet, and wherein an internal width of the lower tank at the lower tank inlet is greater than an internal width of the lower tank at a lower tank outlet.

2. The method of claim 1, further comprising generating a continuous circulating flow of the resist material in the resist tank structure, from the resist tank structure to the resist pump device and, via the resist filter between the resist supply and the resist tank structure, back to the resist tank structure.

3. The method of claim 1, further comprising producing the continuous flow of the resist material from when the resist material enters the upper tank until the resist material exits the lower tank.

4. The method of claim 1, wherein the resist tank structure is vertically arranged such that the resist material enters from a top of the resist tank structure and exits from a bottom of the resist tank structure, the method further comprising:
   producing the continuous flow in a downward direction from when the resist material enters the resist tank structure until the resist exits the resist tank structure.

5. The method of claim 1, wherein a steady flow device is arranged between the resist tank structure and the resist pump device, the method further comprising:
   producing the continuous flow by controlling the flow of the resist material through the steady flow device.

6. The method of claim 5, further comprising:
   dispensing the resist material through the resist nozzle on a wafer;
   producing an image of the resist material on the wafer;
   detecting a number of defects per unit area of the resist material on the wafer; and
   adjusting the continuous flow based on the detected number of defects.

7. The method of claim 1, wherein the resist material is in constant motion inside the resist tank structure.

8. A method of dispensing a resist material on a wafer, comprising:
   flowing the resist material from a resist supply through a resist filter to a resist tank structure;
   flowing the resist material from the resist tank structure through a resist pump device to a resist nozzle, wherein a first portion of the resist material is dispensed through the resist nozzle on the wafer;
   monitoring a pressure of the resist pump device; and
   adjusting a continuous flow of the resist material in the resist tank structure based on the pressure of the resist pump device,
   wherein the resist tank structure comprises a substantially vertically oriented and taper-shaped upper tank and a taper-shaped lower tank connected and oriented at angle $\theta$ to the upper tank where $90°<\theta<135°$, wherein an internal width of the upper tank at an upper tank inlet is greater than an internal width of the upper tank at an upper tank outlet, and wherein an internal width of the lower tank at the lower tank inlet is greater than an internal width of the lower tank at a lower tank outlet.

9. The method of claim 8, further comprising:
   generating a circulating flow by directing a second portion of the resist material from the resist pump device back to the resist filter; and
   continuously flowing the resist material in the resist tank structure and from when the resist material leaves the resist tank structure to the resist pump device and, via the resist filter between the resist supply and the resist tank structure, back to the resist tank structure.

10. The method of claim 8, further comprising producing the continuous flow by directing the second portion of the resist material via the resist filter to the resist tank structure.

11. The method of claim 8, further comprising producing a laminar flow from when the resist material leaves the resist supply until the resist material is dispensed on the wafer, wherein no bubbles are generated by the laminar flow.

12. The method of claim 8, further comprising:
receiving a number of defects per unit area of the resist material on the wafer; and
adjusting the continuous flow based on the number of defects.

13. The method of claim 8, wherein the continuous flow of the resist material in the resist tank structure is adjusted by adjusting a steady flow valve connected between the resist tank structure and the resist pump device based on the monitored pressure of the resist pump device.

14. The method of claim 8, wherein a resist material flow is divided at the resist pump device into the first portion and the second portion, wherein the first portion dispenses over the wafer and the second portion returns, via the resist filter between the resist supply and the resist tank structure, to the resist tank structure, wherein the second portion flows when the resist material dispenses on the wafer and when the resist material does not dispense on the wafer, and wherein the second portion produces the continuous circulating flow.

15. The method of claim 8, further comprising:
acquiring an image of a resist layer disposed over the wafer;
detecting a number of defects of the resist layer over the wafer; and
adjusting the continuous flow of the resist material in the resist tank structure based on the detected number of defects.

16. A method of dispensing resist material, comprising:
flowing a resist material from a resist supply through a resist filter to a resist tank structure; and
flowing the resist material vertically downstream in the resist tank structure and through a resist pump device to a resist nozzle, wherein the resist material continuously flows downward from where the resist material enters the resist tank structure until the resist material exits the resist tank structure,
wherein the resist tank structure comprises a substantially vertically oriented and taper-shaped upper tank and a taper-shaped lower tank connected and oriented at angle θ to the upper tank where 90°<θ<135°, wherein an internal width of the upper tank at an upper tank inlet is greater than an internal width of the upper tank at an upper tank outlet, and wherein an internal width of the lower tank at the lower tank inlet is greater than an internal width of the lower tank at a lower tank outlet.

17. The method of claim 16, further comprising generating a continuous circulating flow of the resist material in the resist tank structure and from the resist tank structure to the resist pump device and, via the resist filter between the resist supply and the resist tank structure, back to the resist tank structure.

18. The method of claim 16, further comprising dispensing a first portion of the resist material through the resist nozzle on a surface of a wafer.

19. The method of claim 18, further comprising flowing a remaining second portion of the resist material through a conduit connected between the resist pump device and the resist filter, wherein the second portion of the resist material flows from the resist pump device through the conduit back to the resist filter, and wherein a single resist pump device is used for dispensing the first portion of the resist material and for the flowing the remaining second portion of the resist material.

20. The method of claim 16, further comprising producing an image of the resist material on the wafer.

* * * * *